United States Patent
Pham et al.

[11] Patent Number: 5,920,786
[45] Date of Patent: Jul. 6, 1999

[54] METHOD FOR FABRICATING SHALLOW ISOLATION TRENCHES USING ANGULAR PHOTORESIST PROFILES TO CREATE SLOPED ISOLATION TRENCH WALLS

[75] Inventors: Tuan D. Pham, Santa Clara; Michael K. Templeton, Atherton, both of Calif.

[73] Assignee: Advanced Micro Devices, Sunnyvale, Calif.

[21] Appl. No.: 09/060,894

[22] Filed: May 14, 1998

[51] Int. Cl.$^6$ ............... H01L 29/68; G03C 5/00; G03F 9/00
[52] U.S. Cl. .................. 438/424; 438/427; 438/430
[58] Field of Search .............. 438/424, 427, 438/430, 312, 310, 316; 430/312, 310

[56] References Cited

U.S. PATENT DOCUMENTS

| | | | |
|---|---|---|---|
| 4,487,652 | 12/1984 | Almgren | 156/643 |
| 4,904,564 | 2/1990 | Chiong | 430/312 |
| 5,010,378 | 4/1991 | Douglas | 257/301 |
| 5,384,159 | 1/1995 | Stolmeijer | 430/312 |
| 5,635,335 | 6/1997 | Bae et al. | 430/312 |
| 5,656,414 | 8/1997 | Chou et al. | 430/312 |
| 5,683,931 | 11/1997 | Takahashi | 430/312 |
| 5,750,441 | 5/1998 | Figura et al. | 430/312 |
| 5,753,417 | 5/1998 | Urlich | 430/312 |
| 5,843,600 | 7/1997 | Chu et al. | 430/312 |

*Primary Examiner*—Charles Bowers
*Assistant Examiner*—David S Blum
*Attorney, Agent, or Firm*—LaRiviere, Grubman & Payne, LLP

[57] ABSTRACT

The present invention provides a method of constructing trenches for use in microelectronic circuit structures. A photolithographic method is used to create trenches with sloped walls shaping the photoresist masks into sloped profiles. These photoresist masks effectively shape the underlying substrate during subsequent etch steps producing sloped wall trenches. These trenches can be used as shallow trench isolation structures to isolate microelectronic circuit structures from each other.

18 Claims, 9 Drawing Sheets

METHOD FOR FABRICATING SHALLOW ISOLATION TRENCHES USING ANGULAR PHOTORESIST PROFILES TO CREATE SLOPED ISOLATION TRENCH WALLS

TECHNICAL FIELD

The present invention relates to the processes used in the fabrication of integrated circuits. More particularly, the invention relates to an advanced method for fabricating sloped wall isolation trenches using shaped photoresist profiles.

BACKGROUND OF THE INVENTION

Microelectronic circuitry uses isolation trenches filled with electrically isolating materials to electrically isolate the individual devices comprising integrated circuits from one another. Abrupt transitions between active and isolation regions are necessary to maximize circuit density. Shallow trench isolation is one means for achieving the necessary abrupt transition. Typical trench fabrication methods feature the etching of vertical walled trenches between active circuit areas, then filling the trenches with electrically isolating material (typically silicon dioxide), thereby electrically isolating independent circuit portions. Existing trench fabrication technologies stress the need for creating trenches with nearly vertical trench walls in order to achieve the requisite abrupt transition between active and isolation regions. In doped wafers, the walls and floors of these isolation trenches are heavily doped increasing their isolating effect and improving the reliability of circuit interconnections. Standard vertical wall trenches present numerous difficulties to the doping process. In order to dope the vertical trench walls the entire surface is angled allowing implantation of the trench walls. Unfortunately, this process does not create a uniformly doped trench with any useful degree of reliability. Moreover, in deep narrow trenches it becomes very difficult to dope the bottom segments of trench walls. Thus, the need to facilitate doping and the need for deep narrow trenches are at cross purposes. Additionally, the nearly vertical walls create sharp angles (nearly 90°) at the trench corners (e.g. angle θ of FIG. 15) which lead to enhanced edge conduction. The sharp edges also cause difficulties in controlling, for example, gate oxide uniformity at the corners. These sharp angles are known to cause electrical failures in integrated circuits and are a serious cause of circuit unreliability. These problems are known as edge effects. Additional problems arise when trenches are doped and used as current paths. For example, in addition to edge effects, vertical walled trenches are prone to contact misalignment which leads to contacts shorting against the substrate and self-aligned gate shorting. This leads to catastrophic circuit failure.

Other existing isolation processes exhibit similar problems, as well as unique problems of their own. For example, the so-called LOCOS method, which selectively oxidizes patterns on a silicon substrate to create isolation regions, suffers from oxide encroachment of silicon dioxide under the silicon nitride layer. This oxide encroachment is known in the industry as a bird's beak. This bird's beak problem reduces the active circuit area between the isolation regions by encroaching into the active regions. As feature size decreases this becomes a more significant problem. Other known processes include a variation of the LOCOS process which is known in the industry as SWAMI, as developed by Hewlett-Packard. The SWAMI process includes outwardly etching the silicon nitride and the pad oxides at 60 degrees such that the subsequent oxidation and beak formation length is limited. Still other methods include using high-pressure oxidation techniques where the oxide is grown faster and at a lower temperature. This results in minimizing the growth of the bird's beak. But, in the end, all of these methods suffer from the bird's beak problem which reduces the active surface area, thereby limiting circuit density.

The primary object of the present invention is to reliably fabricate sloped wall isolation trenches which avoid self-aligned source shorting and contact misalignment shorting. Another object is to provide isolation trench profiles which are more easily doped, thereby creating a more reliable isolation trenches. Another important object is the fabrication of sloped wall isolation trenches which reduce edge effects and thereby increase circuit reliability. A related object of the present invention is to provide an isolation trench which does not suffer from the bird's beak problem and thereby conserves the maximum amount of microchip surface area.

Finally, the present invention provides fabrication processes for manufacturing microelectronic integrated circuit structures featuring isolation trenches with reliably sloped walls in accordance with the foregoing objects. The key objective of the invention is to overcome the difficulties presented in reliably producing trenches with controlled slope walls.

SUMMARY OF THE INVENTION

The present invention is a method of fabricating trenches. In particular, the invention produces sloped wall isolation trenches which are easier to dope and exhibit a lower circuit failure rate due to edge effects. The present invention eliminates issues of self-alignment source shorting and contact misalignment shorting. The isolation trenches of the present invention do not suffer from the bird's beak problem. Therefore the active circuit area size is not reduced by bird's beak intrusion. This allows higher circuit density.

Standard wafer fabrication techniques are used to create the basic semiconductor substrate (typically, crystalline silicon or crystalline gallium arsenide). Later, this basic semiconductor substrate (which may be doped or not) is oxidized. (See FIG. 1). The substrate is then coated with photoresist by methods known to practitioners with ordinary skill in the art (see FIG. 2).

Typically, the photoresist layer is exposed through openings in a mask pattern. As a result the mask pattern is transferred to the photoresist. Typically this is done by focusing the light on the surface of the wafer (i.e. photoresist) through the mask pattern exposing the photoresist coated surface to light. The photoresist surface is then developed and rinsed, leaving a pattern. When the exposing light is sharply focused, sharp vertical walls are patterned into the photoresist. This technique is used for both positive photoresists and negative photoresists.

A positive photoresist is insoluble when coated, but becomes soluble when exposed to light. The result is that when the soluble portions are washed away during the development step, a pattern remains. A negative photoresist is soluble when coated. In certain types of negative photoresists, exposure to light causes insolublization. Therefore the exposed regions are no longer soluble. As with positive photoresists, the soluble regions are removed during development leaving a pattern which is used for later surface etching processes. A key element in the exposure process involves sharply focusing the exposing light onto the semiconductor surface. Exposing the wafer surface either above or below the focal plane leads to aberrations in the exposure profile (e.g. see, FIGS. 6a and 6c). These aberrations are normally avoided because they do not lead to the vertical exposure profile depicted in FIG. 3b.

The present invention is an improved method for fabricating shallow isolation trenches with sloped wall profiles. The cornerstone of the invention is the creation of shaped photoresist mask profiles which lead to sloped wall isolation trench profiles.

BRIEF DESCRIPTION OF DRAWINGS

For a fuller understanding of the present invention, reference is made to the accompanying drawings in the following Detailed Description of the Invention.

FIG. 6a shows the resulting approximate developed pattern of a positive photoresist after exposure as shown in FIG. 6A.

FIG. 6b shows the resulting exposure pattern after exposure as shown in FIG. 6B.

FIG. 6c shows a resulting approximate developed pattern of a positive photoresist after exposure as shown in FIG. 6C.

FIG. 16 also displays the less radical trench edge profiles.

DETAILED DESCRIPTION OF THE INVENTION

The methods of the present invention are used to fabricate sloped wall trenches. These trenches can serve as electrical isolation between adjacent microelectronic circuit components. The following embodiment is the best mode for creating these structures.

Figure 1:
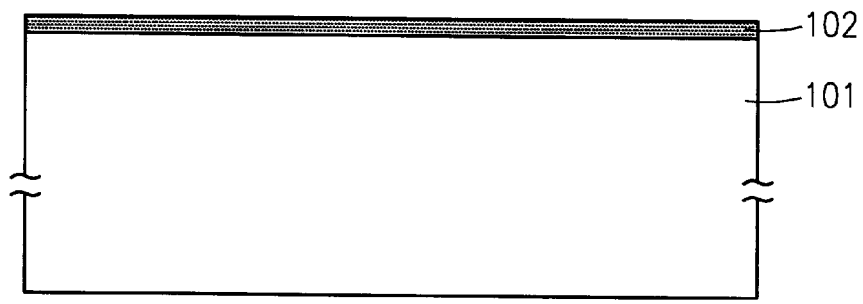
FIG. 1 shows a typical semiconductor substrate with a barrier layer.
Figure 2:
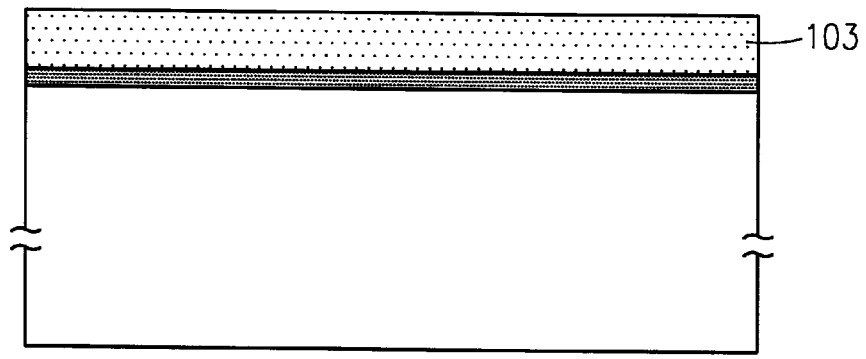
FIG. 2 shows the same substrate as depicted in FIG. 2 after being coated with a photoresist layer.
Figure 3A:
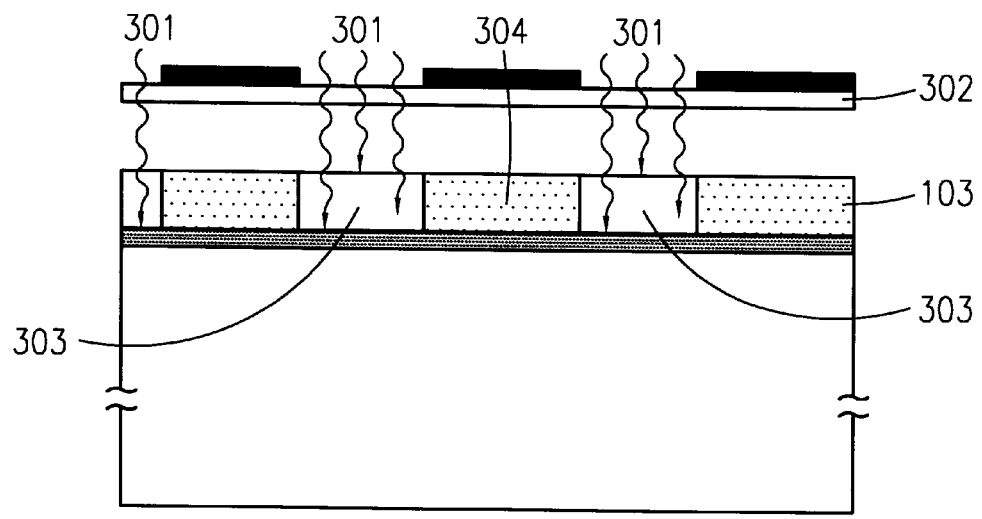
FIG. 3A shows the exposure of a positive photoresist through a pattern mask.
Figure 3B:
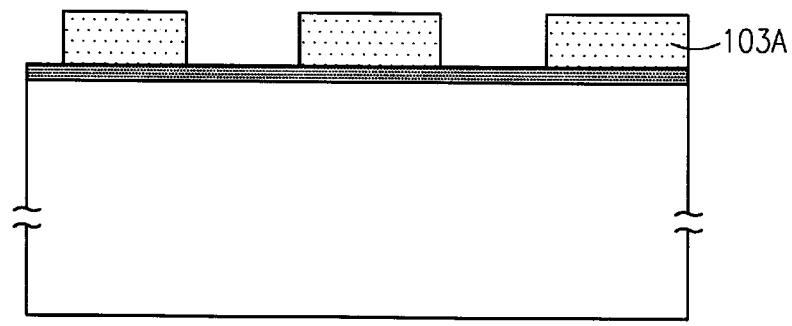
FIG. 3B shows the surface of FIG. 3A after the exposed regions have been removed.
Figure 3C:
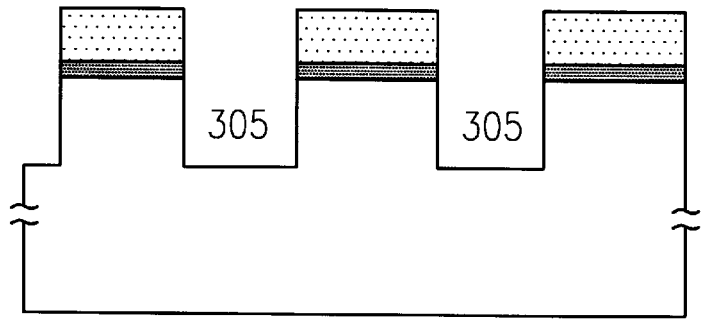
FIG. 3C shows the surface of FIG. 3B after etching creates vertically walled trenches in the substrate.

Ordinarily a semiconductor substrate (typically, crystalline silicon or crystalline gallium arsenide) is provided with a first barrier layer. Using a silicon substrate the first barrier is typically silicon dioxide. FIG. 1 depicts a semiconductor substrate (101) with a first barrier layer (102), which is typically between 100 Å–300 Åthick. It should be noted that the first barrier layer (102) is not necessary to practice the invention. FIG. 2 shows this basic wafer coated with a layer of photoresist (103). Either positive or negative photoresists may be used. The invention is illustrated using a positive photoresist. However, all the techniques and methods disclosed are applicable to negative photoresist embodiments. As shown in FIG. 3A, the photoresist layer (103) is exposed to light (301) as it is passed through openings in a mask pattern (302). When positive photoresists are used, the areas exposed to light (303) become soluble while the unexposed areas (304) remain insoluble. Because the light (301) is sharply focused, the photoresist profile (103A) after exposure and development, is approximately vertical in nature (as shown in FIG. 3B). This leads to approximately vertical walled trenches (305) as shown in FIG. 3C after typical directional plasma etch as is known in the art. As disclosed above, vertical wall trenches have a number of performance limitations. Sloped wall trenches overcome many of these limitations. The key to the present invention is the reliable fabrication of a sloped photoresist profile (R of FIG. 4). The inventor's method of fabricating sloped wall isolation trenches begins with the same starting materials as the prior art.

Figure 5:
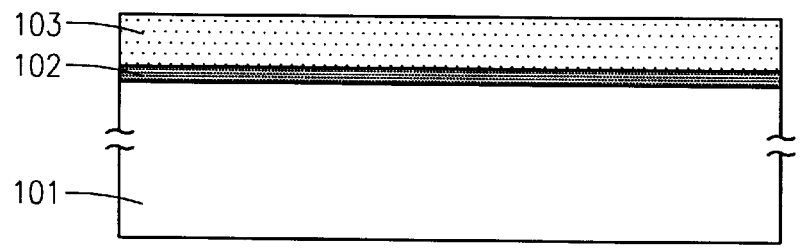
FIG. 5 shows the typical starting wafer with photoresist coating in place.

FIG. 5 shows a semiconductor substrate (101) with a first barrier layer (102). Silicon dioxide is typically used as a barrier layer (102). This first barrier layer is typically between 100 Åto 300 Åthick. Photoresist (103) covers the first barrier layer (102). The pictured embodiment depicts the use of positive photoresist (103). However, the invention may be practiced with equal effectiveness by using either positive or negative photoresists.

Figure 4:
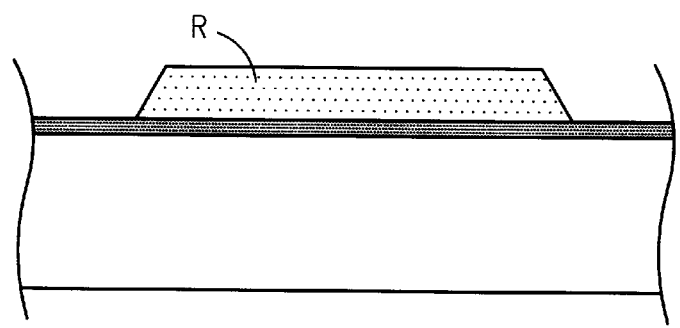
FIG. 4 shows the photoresist profile used in the present invention.
Figure 6A:
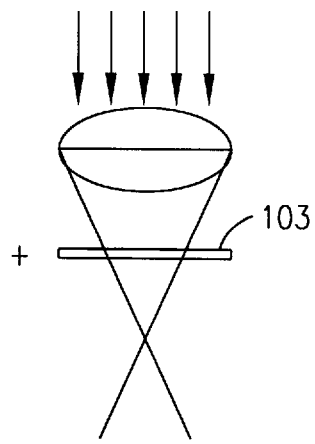
FIG. 6A shows an above focal plane exposure of a wafer of the present invention.
Figure 6A:
Figure 6B:
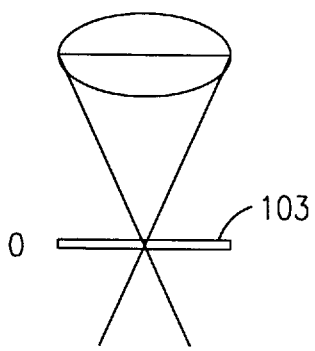
FIG. 6B shows the exposure of a wafer of the present invention with the wafer exposed while in the focal plane.
Figure 6B:
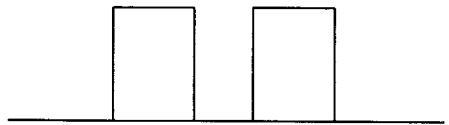
Figure 6C:
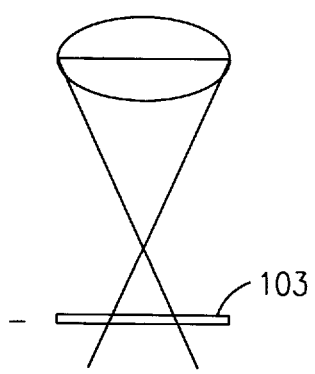
FIG. 6C shows a below focal plane exposure of a wafer of the present invention.
Figure 6C:
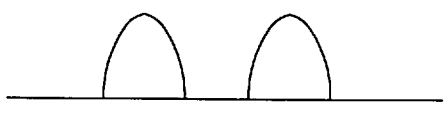

An important aspect of the invention is the creation of a photoresist pattern having sloped edges (as shown in FIG. 4). This can be accomplished by a number of photolithographic means which are known to persons with ordinary skill in the art. Previously, these effects have been considered aberrations to be avoided. Ordinarily, a stepper is used to focus the exposing light on the substrate surface (e.g. as in FIG. 3A and FIG. 6B) leading to substantially vertical photoresist walls (as in FIG. 3B). However, by exposing the photoresist (103) with unfocused light, the walls of the photoresist profile may be altered. The photoresist profile of the present invention may be formed using the staged incremental photolithographic exposure techniques set forth below. For example if, as in FIG. 6A, the photoresist (103) is exposed while above the focal plane, an exposure profile similar to that of FIG. 6a is created. If exposing again while in focus, as in FIG. 6B, an exposure profile like that of FIG. 6b is achieved. In a final exposure, below the focal plane (FIG. 6C), a photoresist exposure profile similar to that of FIG. 6c is added to the existing profiles. By a novel stage combination of these exposure profiles (6a, 6b and 6c) in conjunction with different amounts of exposure energy at the different exposure focal planes an exposure profile similar to that of FIG. 4 is created. An important aspect of the invention is to use an imaging system with a high enough numerical aperture so that these effects can be created. Typically, these effects can be created by imaging systems with numerical apertures as low as 0.35. However, it is preferable to use systems with a numerical aperture of about 0.45. This exposure can be done in as many focal increments as desired leading to very precisely shaped photoresist profile, although it is more practical to use fewer increments, e.g. 3, to increase throughput.

Additionally, the inventors use the intensity of the exposing light to shape the profile. More intense light leading to narrower profiles and less intense light leading to wider profiles. The juxtaposition of a series of varied intensities leads to a developed photoresist profile similar to FIG. 4. Both methods may be used in conjunction to more efficiently shape the photoresist profile. For example, when using a positive photoresist, a first exposure above focus (as in FIG. 6A) may be used with a high intensity light exposure, followed by a second exposure in focus (as in FIG. 6B) using a lower intensity light exposure. Finally, a third exposure below focus (as in FIG. 6C) using a lowest intensity light will lead to a profile like FIG. 4. If a negative photoresist is used, the process is just the opposite (i.e., a low intensity light is used when the exposure is above focus, as in FIG. 6A; a higher intensity light is used when exposure is in focus, as in FIG. 6B; and a highest intensity light is used when the exposure is below focus, as in FIG. 6C.) The invention may be practiced by using any number of subtle combinations of exposure intensities and focal states. All of which will be used to shape the photoresist profile and thereby influence the final shape of the isolation trench.

Figure 7:
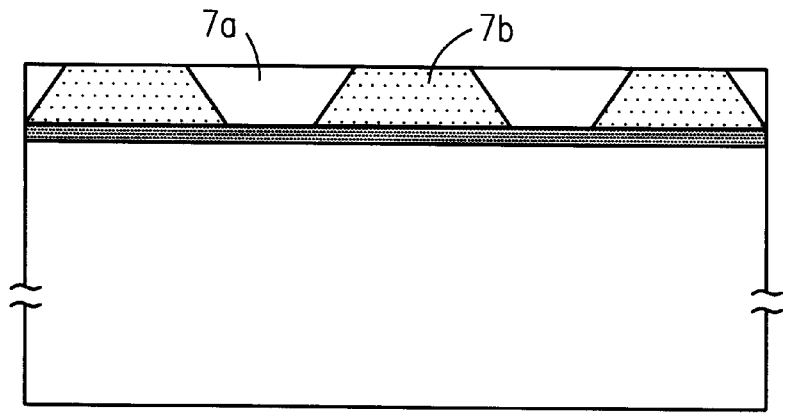
FIG. 7 depicts the effects of exposure by the methods of the present invention showing the sloped photoresist profile.
Figure 8:
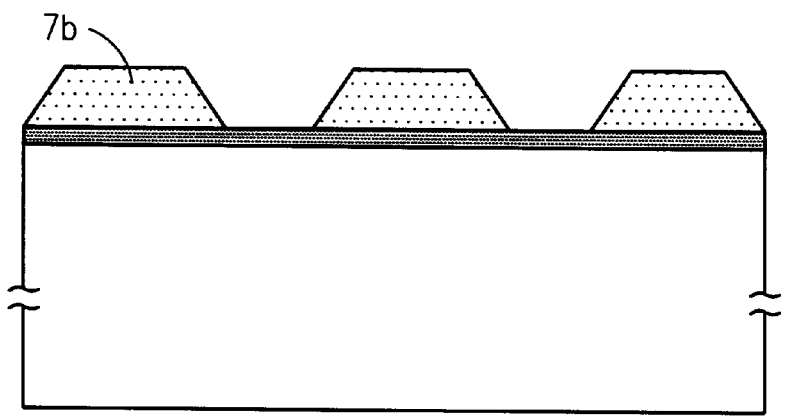
FIG. 8 shows the photoresist profile after soluble photoresist is removed leaving a sloped photoresist profile.

FIG. 7 depicts a positive photoresist after exposure. The exposed regions (7a) are solubilized and will be removed. FIG. 7 also depicts the sloped profile of the unexposed photoresist (7b). The solubilized photoresist (7a) is developed out by any of the standard means known to those with ordinary skill in the art. After this step, a shaped photoresist remains (7b) as depicted in FIG. 8.

Figure 9:
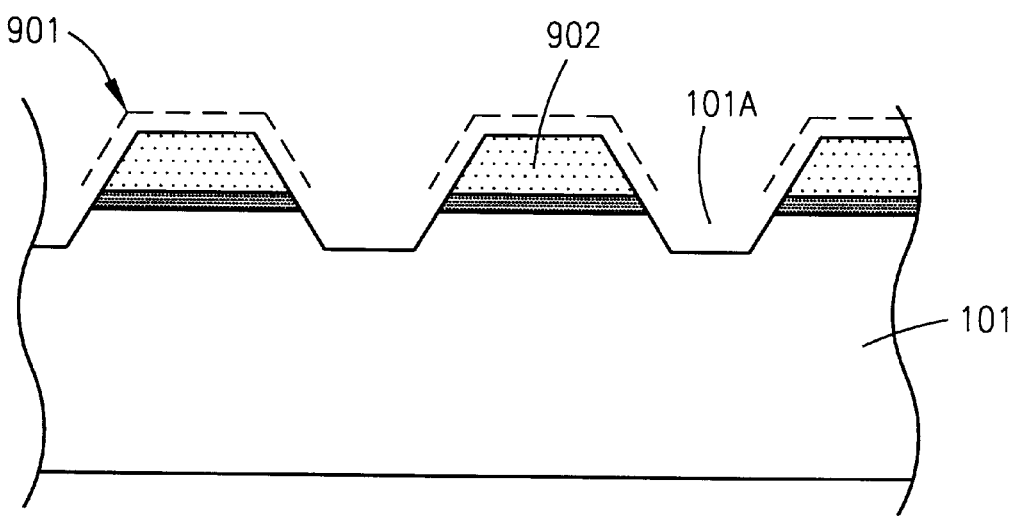
FIG. 9 shows the effects of the first etch of the surface of FIG. 8.

Once the sloped profile photoresist is in place, the semiconductor substrate is anisotropically etched. Dry etch techniques are used because of their directional etch characteristics. Any anisotropic etch technique (e.g. plasma etching, reaction ion etching ("RIE"), ion milling, etc.) may be used, but the preferred method is plasma etching. The first etch step serves to weaken the surface of the semiconductor substrate (101) in the regions defined by the photoresist creating a trench region (101A) as is shown in FIG. 9. The plasma etch also erodes a portion of the photoresist. The original photoresist profile is shown by the dotted line (901), with eroded profile depicted as (902). As a result of the photoresist erosion, the trench region manifests a sloped profile (101A). After the first etch is complete, the remaining photoresist (902) is stripped.

Figure 10:
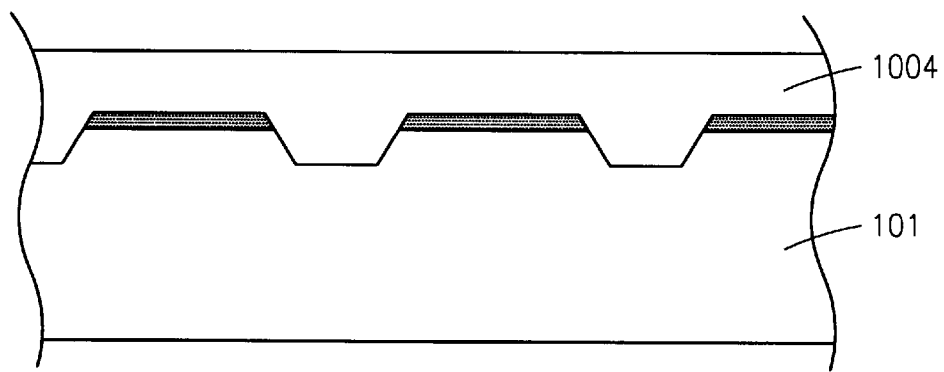
FIG. 10 shows the fabrication of a barrier layer over the surface of FIG. 9.

FIG. 10 depicts the surface after coverage with a barrier (1004) material which is chosen for good etch selectivity between the barrier layer (1004) and the substrate (101)(for silicon substrates this is typically silicon nitride ($Si_3N_4$), but may consist of silicon oxynitride ($SiO_xN_y$, where x and y describe the ratio of oxygen to nitrogen) or any other suitable barrier material). This barrier layer (1004) is about 500 Å and 2000 Å thick, preferably forming a layer approximately 1700 Å thick. Methods of forming the barrier layer are known to any practitioner with ordinary skill in the art. The barrier layer (1004) is masked (as in FIG. 11) with a second photoresist (1105) by any of the prior art methods. The second photoresist (1105) defines the final trench widths (w) (usually between 0.1 μm and 0.7 μm).

Figure 11:
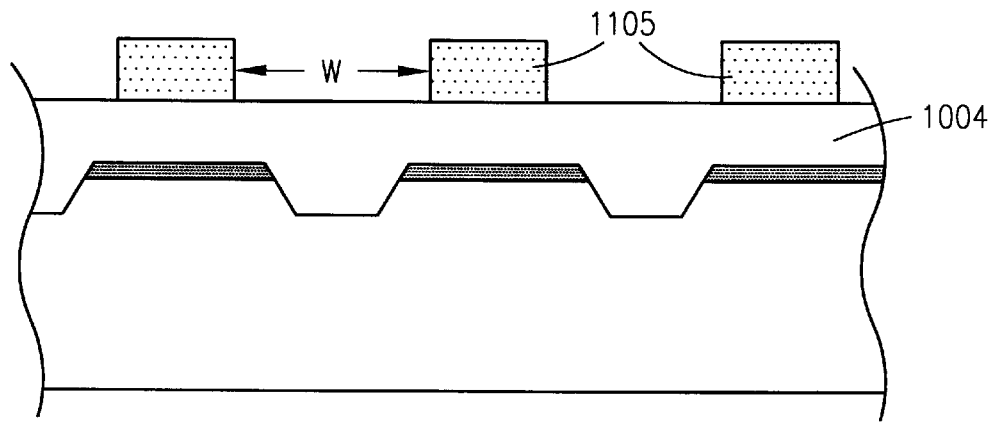
FIG. 11 shows FIG. 10 after masking for a second etch.
Figure 12:
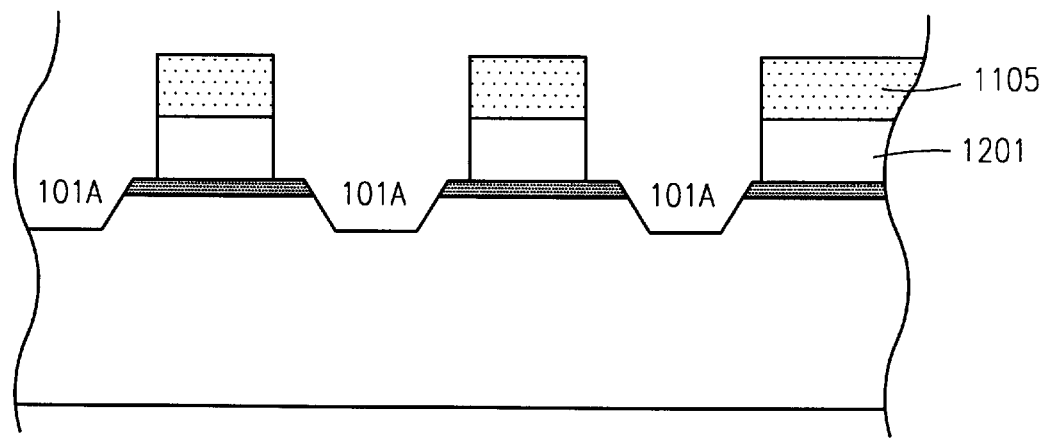
FIG. 12 shows the second etch which removes the barrier layer from the surface of FIG. 11.
Figure 13:
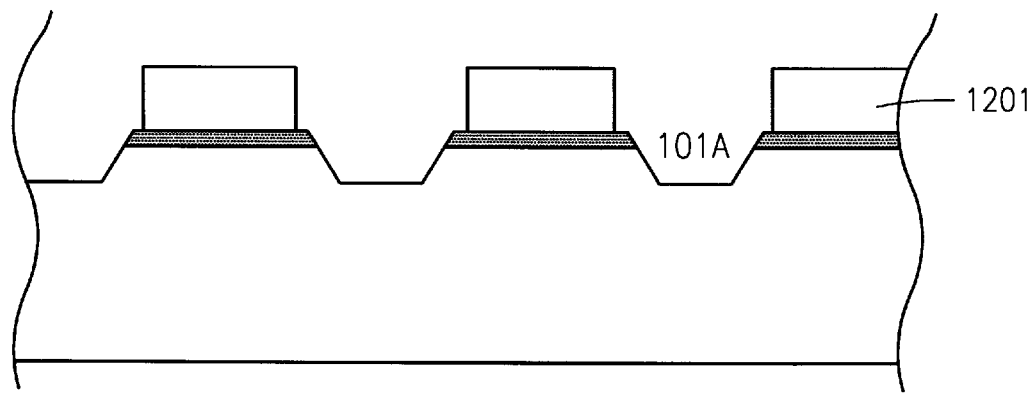
FIG. 13 shows FIG. 12 after the photoresist is stripped.

FIG. 12 shows the surface of FIG. 11 after the barrier layer (typically $Si_3N_4$) has been etched away in a second etch. The second etch is accomplished using anisotropic etch techniques, typically plasma etching. The second etch etches away the barrier layer until the semiconductor substrate is reached in the trench region (101A). The photoresist layer (1105) is then stripped from the remaining barrier layer (1201). FIG. 13 shows the surface in preparation for a third etch. The remaining barrier layer serves as an etch mask (1201). This surface is anisotropically etched for a third time, leading to the sloped trench wall profile (101B) shown in FIG. 14. Further, the trench region (101A) having been etched by all prior etch steps is often weakened and can be more susceptible to subsequent etching. This means that the trench region (101A) can be etched away faster still, resulting in a final etch profile with sloped walls. This slope is shown by (101B) of FIG. 14.

Figure 14:
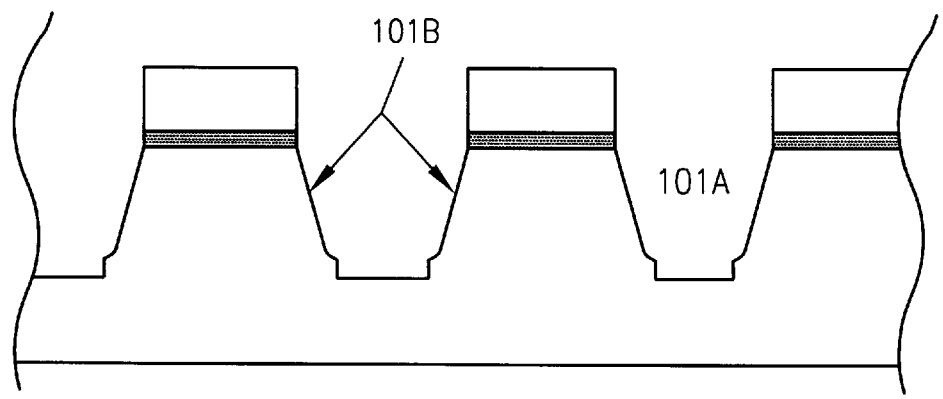
FIG. 14 shows the surface of FIG. 13 after a third etch. This view also shows the final shallow isolation trench profile, including sloped trench walls.
Figure 15A:
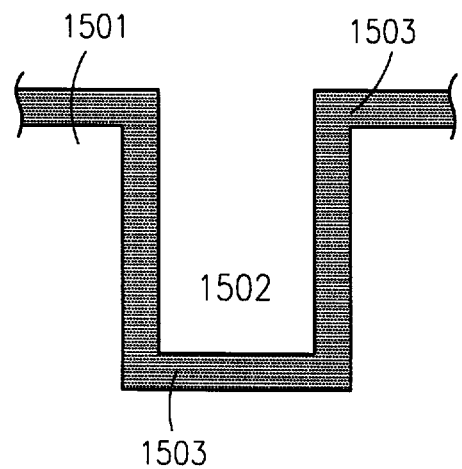
FIG. 15A shows a vertical walled trench with an idealized dopant implantation profile.
Figure 15B:
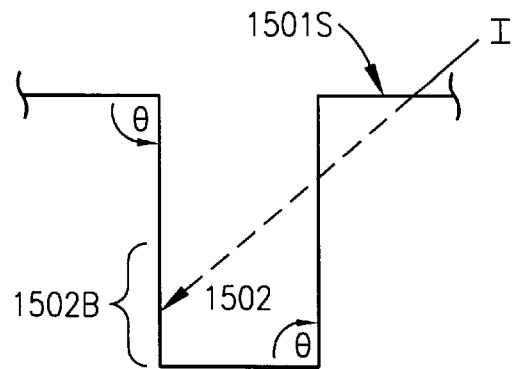
FIG. 15B is an exemplar of the problems encountered when trying to implant a vertical walled trench with dopant ions. Also shown are the sharp corner angles.
Figure 15C:
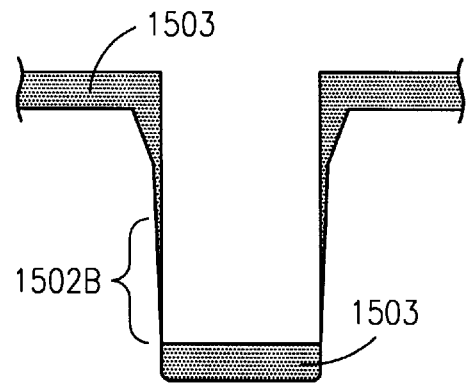
FIG. 15C shows a typical doping profile in a vertical walled trench illustrating the difficulties in doping the bottom segments of the vertical trench wall.
Figure 16:
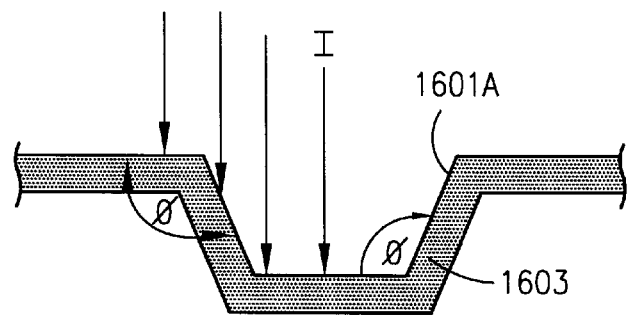
FIG. 16 shows the doping profile achieved by a typical sloped wall trench.

The sloped trench structures of FIG. 14 have several advantages over vertical walled prior art trench structures. When used as isolation structures in CMOS systems, vertical walled trenches present certain process difficulties. FIG. 15A depicts, for example, a vertical walled isolation trench (1502) in a lightly doped substrate (1501). In order to enhance the isolation properties of the trench (1502), the trench boundaries (1503) are heavily doped with ions of the same charge as the lightly doped substrate (1501). The dopant profile (1503) is ideal and is not realized in actual trenches. This doping is typically accomplished using an ion implanter. As is shown in FIG. 15B, when implanting deep trenches the substrate surface (1501S) blocks the ion implantation beam (I) from implanting the bottom portions of the isolation trench (1502B). This leads to the non-uniform dopant implantation profile (1503) shown in FIG. 15C. The thin dopant profile in the bottom of trench walls (1502B) leads to isolation failure and circuit unreliability. This is remedied by using isolation trenches featuring sloped walls, as shown in FIG. 16. The sloped walls (1601A) allow dopant implantation (I) at an angle normal to the surface. This is not possible with vertical trench walls. The result is a more uniform dopant profile (1603) in the isolation trench wall and better isolation. Another key advantage of the invention is that the sloped trench walls reduce the edge effect and enhances circuit reliability. A typical vertical walled trench has sharp trench corners (θ=nearly 90° as in FIG. 15B). These angles (θ=90°) cause enhanced edge conduction. This edge conduction leads to circuit failure. The present invention (as shown in FIG. 16) has edge angles (φ) of greater than 90°. This significantly reduces circuit failure.

Figure 17A:
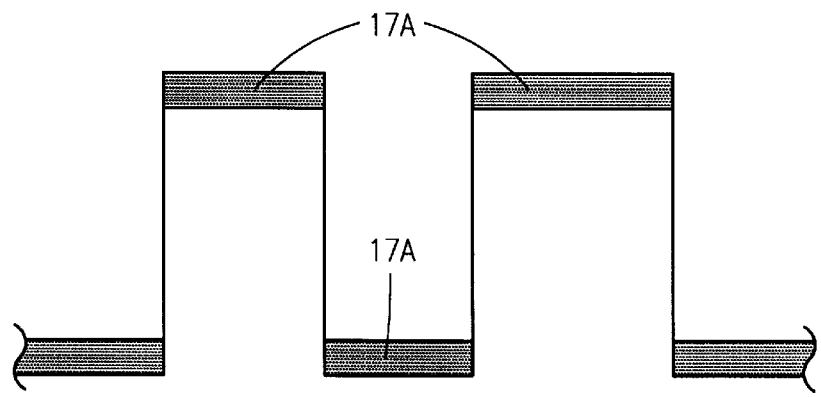
FIG. 17A shows a typical dopant profile in vertical walled trench structures.
Figure 17B:
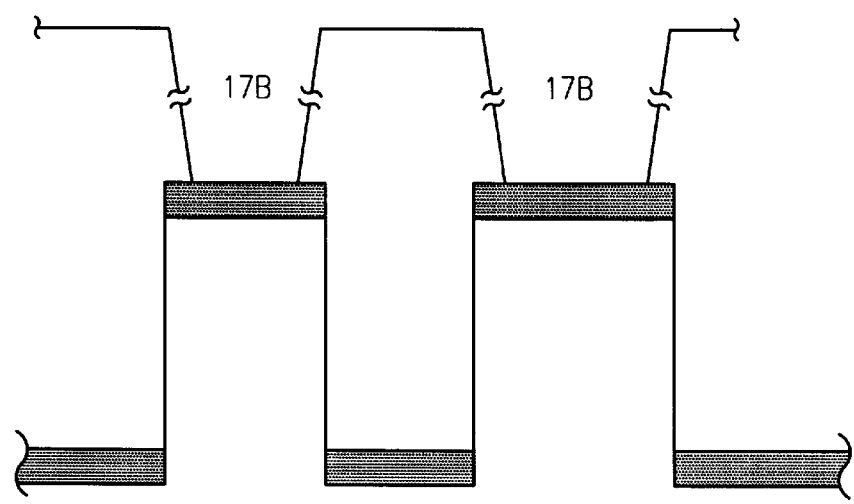
FIG. 17B shows a well aligned contact in place on the structure of FIG. 17A.
Figure 17C:
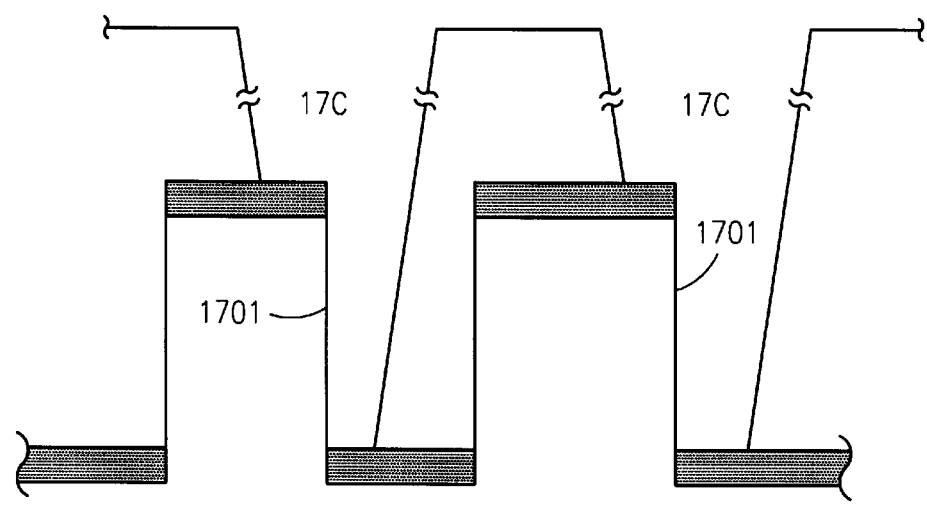
FIG. 17C shows a typical misaligned contact problem common with vertical wall trenches.
Figure 18A:
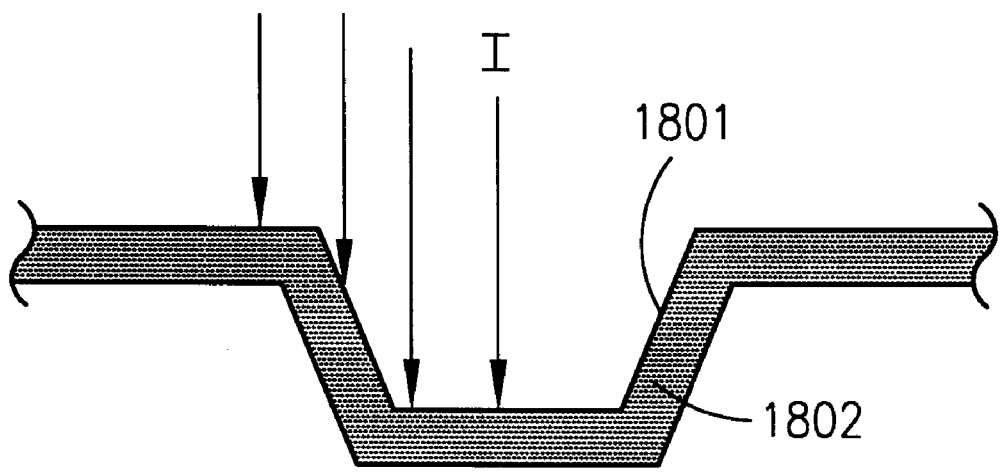
FIG. 18A shows a typical doping profile in a sloped wall trench.
Figure 18B:
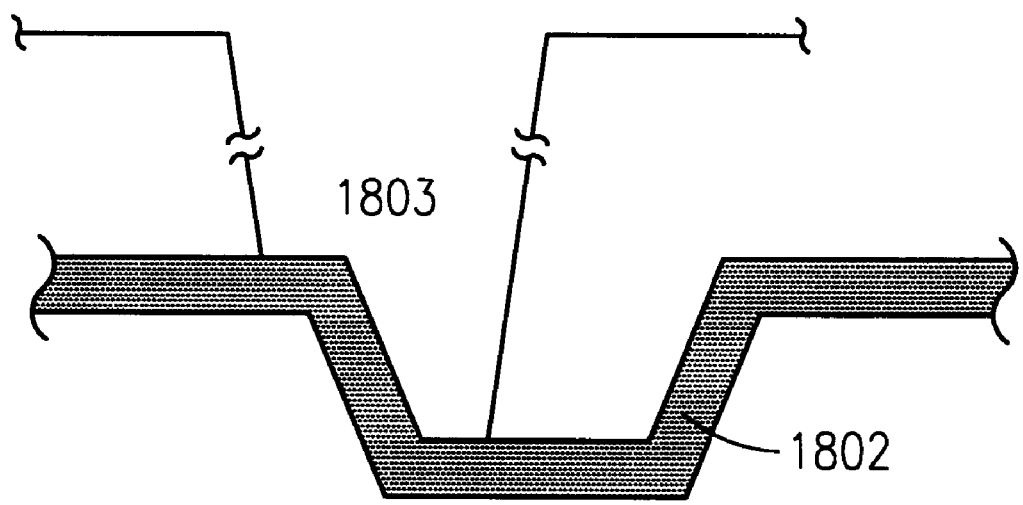
FIG. 18B shows how the doping profile achieved in a sloped trench avoids the misaligned contact problem.

Another advantage of the present invention is the prevention of misaligned contact shorting. Semiconducting substrate surfaces are often doped to create current paths rather than isolation regions. The resulting doped current paths (17A) in prior art vertical trenches are shown in FIG. 17A. When metallic contacts (17B) are put in place, as in FIG. 17B, they supply microcircuit structures with current. Unfortunately, there are frequently incidents of misalignment (as shown in FIG. 17C). In such cases the misaligned metallic contact (17C) touches the substrate (1701) shorting out the circuit against the trench wall causing failure. The sloped wall structure of the present invention (1801) as depicted in FIG. 18A avoids this problem. The walls are doped (1802) with an ion implanter (I) to create current paths. When misalignment occurs (as in FIG. 18B) there is no shorting because the metallic contact (1803) is always in contact with a doped current path (1802). Therefore, shorting is not possible. The present invention has been particularly described with respect to a certain preferred embodiment. However, it is readily apparent to one with ordinary skills in the art that various changes and modifications in form, semiconductor material, dielectric material, isolation material, oxide material, negative or positive photoresist, material conductivity, i.e. N-type, P-type, and detail may be made without departing from the spirit and scope of the invention. The inventions disclosed herein may be practiced without any element which is not specifically disclosed herein.

What is claimed is:

1. A process for fabricating sloped wall trenches in semiconductor substrates comprising the following steps:
   a) providing a semiconductor substrate;
   b) forming and shaping a sloped profile photoresist mask on said semiconductor substrate using combined exposure profiles utilizing unfocused light;
   c) a first etching step for removing portions of said semiconductor substrate, said sloped profile photoresist mask facilitating the creation of a sloped wall trench region in said substrate;
   d) removing said photoresist mask;
   e) forming a barrier layer over said semiconductor substrate and said trench region;
   f) forming a second photoresist mask layer on said barrier layer with openings in said mask layer over said trench region;
   g) performing a second etching step to remove portions of said barrier layer from said trench region; and
   h) performing a third etching step in said trench region to form sloped wall trenches.

2. A process as in claim 1 wherein said second etching step, g), forms a substantially vertical walled aperture pattern in said barrier layer, said barrier apertures being in register with said sloped wall trench regions.

3. A process for shaping a sloped wall photoresist profile on a semiconductor substrate comprising the following steps:
   a) coating said substrate with a layer of photoresist material;
   b) providing a mask for transferring a pattern to said photoresist layer;
   c) transferring said mask pattern to said photoresist layer using a juxtaposition of combined exposure profiles utilizing unfocused light to slope and shape said photoresist profile; and
   d) removing soluble portions of said photoresist layer leaving a photoresist pattern having a sloped profile.

4. A process as in claim 3 wherein said step c), comprises the steps of:
   a) using a stepper to expose said photoresist layer to light while said photoresist layer is above the focal plane of said exposing light;
   b) using said stepper to expose said photoresist layer to light while said photoresist layer in the focal plane of said exposing light; and
   c) using said stepper to expose said photoresist layer to light while said photoresist layer is below said focal plane.

5. A process as in claim 3 wherein said step c), comprises the steps of:
   a) using a stepper to expose said photoresist layer to high intensity light in a first exposure;
   b) using said stepper to perform a second exposure of said photoresist layer using a light intensity less than said first exposure; and
   c) using said stepper to perform a third exposure of said photoresist layer using a light intensity less than said second exposure.

6. A process as in claim 3 wherein said photoresist layer is comprised of positive photoresist material and said step c), comprises the steps of:
   a) using a stepper to expose said photoresist layer to high intensity light in a first exposure while simultaneously using said stepper to expose said photoresist layer to said high intensity light while said photoresist layer is above the focal plane of said high intensity light;
   b) using said stepper to perform a second exposure of said photoresist layer using a light intensity less than said first exposure while said photoresist layer is in the focal plane of said exposing light; and
   c) using a stepper to expose said photoresist layer to a third exposure of light, said third exposure having less intensity than said second exposure while simultaneously exposing said photoresist layer below the focal plane of said lesser intensity light.

7. A process as in claim 3 wherein said photoresist layer is comprised of negative photoresist material and said step c), comprises the steps of:
   a) using a stepper to expose said photoresist layer to high intensity light in a first exposure while simultaneously using said stepper to expose said photoresist layer to said high intensity light while said photoresist layer is below the focal plane of said high intensity light;
   b) using said stepper to perform a second exposure of said photoresist layer using a light intensity less than said first exposure while said photoresist layer is in the focal plane of said exposing light; and
   c) using a stepper to expose said photoresist layer to a third exposure of light, said third exposure having less intensity than said second exposure while simultaneously exposing said photoresist layer above the focal plane of said lesser intensity light.

8. A process as in claim 3 wherein said sloped wall photoresist profile is further used to fabricate sloped wall trenches in said semiconductor substrate using the following further steps comprising:
   e) a first anisotropic etching step to remove selected portions of said semiconductor substrate, said sloped wall photoresist profile facilitating the creation of a sloped wall trench region in said substrate;
   f) removing said photoresist;
   g) forming a barrier layer on the surfaces of said semiconductor substrate and said trench region;
   h) forming a second photoresist layer on said barrier layer with openings in said photoresist layer over said trench region;
   i) performing a second anisotropic etch to form a substantially vertical walled opening in said barrier layer in said trench region; and j) performing a third anisotropic etch in said trench region forming a sloped wall trench in said semiconductor substrate.

9. A process as in claim 8 wherein said semiconductor substrate is provided as a silicon substrate and step g) comprises forming a silicon nitride barrier layer.

10. A process as in claim 8 wherein said step of forming a barrier layer comprises forming a barrier layer from material selected from the group consisting of silicon oxynitride or silicon nitride.

11. A process as in claim 8 wherein said first, second, and third anisotropic etching steps e), i) and j) are performed using plasma etch techniques.

12. A process for forming reliably sloped profile trenches having a width of less than about 0.7 micron in a semiconductor substrate comprising the following steps:

a) providing a semiconductor substrate;

b) forming a photoresist layer over said substrate;

c) exposing said photoresist layer to a series of combined exposure profiles utilizing unfocused light to form a first photoresist mask pattern having a plurality of sloped profile apertures;

d) performing a first substrate etching step to remove portions of said substrate through said apertures forming a plurality of sloped wall trench regions in said substrate surface;

e) stripping said photoresist mask pattern;

f) forming a barrier layer over said semiconductor substrate and trench regions;

g) forming a second photoresist mask pattern on said barrier layer, said photoresist pattern having a plurality of openings in register with said plurality of trench regions;

h) performing a barrier etching step, removing said barrier layer in said trench regions to form a barrier mask pattern with a plurality of substantially vertical walled barrier openings in register with said plurality of trench regions;

i) stripping said second photoresist mask; and j) performing a third etching step, removing portions of said semiconductor substrate in said plurality of trench regions through said plurality of barrier openings, forming a plurality of sloped wall trenches having a trench width of less than about 0.7 micron.

13. A process as in claim 12 wherein said step c), exposing said photoresist layer to a series of combined exposure profiles, comprises the steps of:

using an imaging system to expose said first photoresist layer to light while said photoresist layer is at a plurality of incrementally adjusted focal distances from the source of said exposing light.

14. A process as in claim 12 wherein said imaging system comprises having a numerical aperture of 0.35 or greater.

15. A process as in claim 12 wherein said step c), exposing said photoresist layer to a series of combined exposure profiles, comprises the steps of:

using an imaging system to expose said first photoresist layer to light at a plurality of incrementally adjusted focal distances from a light source while incrementally varying the intensity of said exposing light.

16. A process as in claim 12 wherein the step c), exposing said photoresist layer to a series of combined exposure profiles, comprises the steps of:

i) using an imaging system to expose said first photoresist layer to a light source while said photoresist layer is above the focal plane of said exposing light source;

ii) using said imaging system to expose said first photoresist layer to said light source while said photoresist layer is in the focal plane of said exposing light source; and iii) using said imaging system to expose said first photoresist layer to said light source while said photoresist layer is below the focal plane of said exposing light source.

17. A process as in claim 12 wherein said first photoresist layer is comprised of positive photoresist material and the step c), exposing said photoresist layer to a series of combined exposure profiles, comprises the steps of:

i) using an imaging system to expose said first photoresist layer to high intensity light in a first exposure while said first photoresist layer is above the focal plane of said high intensity light;

ii) using said imaging system to perform a second exposure of said first photoresist layer using a light intensity less than said first exposure while said first photoresist layer is in the focal plane of said exposing light; and iii) using said imaging system to expose said first photoresist layer to a third exposure of light, said third exposure having less intensity than said second exposure while said first photoresist layer is below the focal plane of said lesser intensity light.

18. A process as in claim 12 wherein said first photoresist layer is comprised of negative photoresist material and the step c), exposing said photoresist layer to a series of combined exposure profiles, comprises the steps of:

i) using an imaging system to expose said first photoresist layer to high intensity light in a first exposure while said first photoresist layer is below the focal plane of said high intensity light;

ii) using said imaging system to perform a second exposure of said first photoresist layer using a light intensity less than said first exposure while said first photoresist layer is in the focal plane of said exposing light; and iii) using said imaging system to expose said first photoresist layer to a third exposure of light, said third exposure having less intensity than said second exposure while said first photoresist layer is above the focal plane of said lesser intensity light.

* * * * *

UNITED STATES PATENT AND TRADEMARK OFFICE
CERTIFICATE OF CORRECTION

PATENT NO : 5,920,786
DATED : July 6, 1999
INVENTOR(S) : Tuan D. Pham and Michael K. Templeton It is certified that error appears in the above-identified patent and that said Letters Patent is hereby corrected as shown below:

Title page, item [22], please delete the date "May 14, 1998" and replace with --April 15, 1998--.

Signed and Sealed this

Ninth Day of May, 2000

Attest:

Attesting Officer

Q. TODD DICKINSON

Director of Patents and Trademarks